United States Patent

Vashchenko

(10) Patent No.: US 8,785,973 B2
(45) Date of Patent: Jul. 22, 2014

(54) ULTRA HIGH VOLTAGE GAN ESD PROTECTION DEVICE

(75) Inventor: Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 441 days.

(21) Appl. No.: 12/799,121

(22) Filed: Apr. 19, 2010

(65) Prior Publication Data

US 2011/0254012 A1    Oct. 20, 2011

(51) Int. Cl.
| | | |
|---|---|---|
| H01L 29/20 | (2006.01) | |
| H01L 21/335 | (2006.01) | |
| H01L 29/778 | (2006.01) | |
| H01L 27/02 | (2006.01) | |
| H01L 29/861 | (2006.01) | |
| H01L 29/205 | (2006.01) | |
| H01L 29/06 | (2006.01) | |

(52) U.S. Cl.
CPC .......... *H01L 29/861* (2013.01); *H01L 27/0248* (2013.01); *H01L 29/2003* (2013.01); *H01L 29/205* (2013.01); *H01L 29/0657* (2013.01)
USPC ............. 257/175; 257/194; 257/76; 257/199; 257/168; 257/173; 257/355; 257/E21.407; 257/E29.246; 257/E29.089; 257/E21.355

(58) Field of Classification Search
CPC ............ H01L 27/0248; H01L 29/0657; H01L 29/205; H01L 29/861; H01L 29/2003
USPC ............ 257/183, 76, 194, E21.407, E29.246, 257/E29.089, 173, E21.355, 199, 168, 175, 257/355
See application file for complete search history.

(56) References Cited

U.S. PATENT DOCUMENTS

| | | | |
|---|---|---|---|
| 7,449,762 B1 * | 11/2008 | Singh | 257/493 |
| 7,915,643 B2 * | 3/2011 | Suh et al. | 257/194 |
| 8,114,717 B2 * | 2/2012 | Palacios et al. | 438/142 |
| 8,144,441 B2 * | 3/2012 | Ping et al. | 361/56 |
| 2005/0194612 A1 * | 9/2005 | Beach | 257/192 |
| 2010/0084687 A1 * | 4/2010 | Chen et al. | 257/194 |
| 2011/0140172 A1 * | 6/2011 | Chu et al. | 257/194 |
| 2011/0186855 A1 * | 8/2011 | Ramdani | 257/76 |

* cited by examiner

*Primary Examiner* — Tom Thomas
*Assistant Examiner* — Benjamin Tzu-Hung Liu
(74) *Attorney, Agent, or Firm* — Eugene C. Conser; Frederick J. Telecky, Jr.

(57) ABSTRACT

In an ultra high voltage lateral GaN structure having a 2DEG region extending between two terminals, an isolation region is provided between the two terminals to provide for reversible snapback.

15 Claims, 5 Drawing Sheets

ULTRA HIGH VOLTAGE GAN ESD PROTECTION DEVICE

FIELD OF THE INVENTION

The invention relates to high voltage Electrostatic Discharge (ESD) protection devices. In particular it relates to high voltage GaN technology.

BACKGROUND OF THE INVENTION

Much recent work has been done in using materials other than Silicon in the manufacture of semiconductor devices. In particular experiments have been conducted on GaAs and GaN process technologies in attempts to use solid state technology in ultra high voltage applications. However, the prior tests have found limitation in these devices in withstanding ESD events due to avalanche breakdown. A typical GaAs device 100 is shown in FIG. 1, which has a drain contact 120 and a source contact 122, separated by a GaN channel region 108 over which is formed an AlN layer 110 in FIG. 1.

In the other prior art structure shown in FIG. 2, an AlGaN layer 130 is formed over the GaN layer 108. Thus the device forms a heterojunction device having a high electron mobility junction formed between two different materials having different band gaps. Due to the bandgap mismatch between the AlGaN and GaN material, the junction between the GaN channel region 108 and AlGaN cap 110 forms a conductive channel region known as a 2D electron gas (2DEG) channel. A semi-insulated AlGaN buffer 106 near the source contact becomes the site of hole accumulation due to holes generated in the channel region 108. The hole charge lowers the barrier at the channel-buffer interface, causing electrons to be injected from the source, thereby creating an avalanche region in the buffer. This causes more holes to be generated and in turn causes more electrons to be injected from the source, leading to avalanche breakdown in the buffer layer.

In one study that was conducted for a floating gate device making use of Schottky contacts to the drain and source, the drain contact was found to be functional to an $I_{stress}$ of 1.75 A, while in a grounded gate device, the contact degradation to the drain contact took place much sooner at an $I_{stress}$ of about 0.2 A, with failure at 0.45 A, probably due to increased temperature in the buffer and power dissipation in the gate region due to holes being collected by the gate. As device width increased the failure current was found to increase in a GaAs device. However GaN devices were found not to be as scalable in size in order to achieve the higher failure currents, possibly because of defects and dislocations in the material.

The present invention provides a more robust GaN device for use in ultra high voltage (UHV) applications with reversible snapback capabilities under Electrostatic Discharge (ESD) stress.

SUMMARY OF THE INVENTION

According to the invention, there is provided a GaN ESD protection device comprising a first terminal with an ohmic contact or Shottky contact, a second terminal with an ohmic contact or Shottky contact, and a 2D electron gas (2DEG) region between the two terminals, wherein there is at least on isolation region formed between the two terminals. The device may further include a GaN channel region and an AlGaN cap layer over the GaN channel region to define the 2DEG region at the junction between the GaN channel region and the AlGaN cap layer. The device may include a buffer region, e.g., an AlGaN buffer region below the GaN channel region. The first terminal may define a drain, and the second terminal may define a source. The at least one isolation region may extend through the 2DEG region, and may comprise one or more etched-away portions or one or more ion implant regions. The at least one isolation region may have a length of the order of 1 um. The GaN channel region between the first terminal and said at least one isolation region may be longer than the length of the said isolation region, e.g., between 1 and 10 um, to define a ballast region for providing greater uniformity of the current density. The GaN device may include a buffer region e.g., one or more AlGaN layers below the GaN channel region. The GaN device may further include a substrate pump defined by a contact extending into the at least one isolation region to allow the potential of the substrate to be changed.

Further, according to the invention, there is provided a method of controlling the breakdown and triggering voltage of an ultra high voltage GaN ESD protection structure that includes a pair of terminals with ohmic or Schottky contacts connected to a 2DEG region, the method comprising providing an isolation region between the terminals and varying the breakdown and triggering voltage of the device by varying the length of the isolation region. The 2DEG region may be defined by an interface between a GaN channel region and an AlGaN layer. The AlGaN layer defining the 2DEG with the GaN channel may be formed on top of the GaN channel to define an AlGaN cap layer. The method may include forming a buffer region e.g. a AlGaN buffer region extending beneath the terminals below the GaN channel. The method may include dimensioning the GaN channel region to be long enough to providing a ballasting region between one of the terminals and the at least one isolation region to provide for greater uniformity of the current density distribution and to move the high electric field and heat generation away from the contacts. For example, the ballast region may be between 1 and 10 um in length. The method my include providing a buffer region e.g., one or more AlGaN layers below the GaN channel region, and the method may include providing a substrate pump by providing a contact extending into the at least one isolation region to allow the potential of the substrate to be changed to lower the triggering voltage. The GaN structure may be formed on a substrate material e.g., a silicon substrate, and the method may further include removing the substrate material after forming at least some of the regions on the substrate material.

Still further, according to the invention, there is provided a grid voltage GaN structure that includes a pair of terminals with ohmic or Schottky contacts, a 2DEG defined by the junction between a GaN layer and an AlGan layer, extending between the contacts, an isolation region between the contacts that extends through the 2DEG to define a ballast region between the one terminal and the isolation region, the ballast region being longer than the isolation region and being defined by the portion of the GaN layer or AlGaN layer extending between the terminal and the isolation region.

DETAILED DESCRIPTION OF THE INVENTION

The present invention proposes the use of solid state ESD protection devices that will be usable in grid level voltage (600V-1 kV) applications. For instance, the use of DC-DC convertors and controllers, e.g. for LED street lighting, electric motors and other grid level voltage applications. In particular, the present invention proposes a new GaN device that is capable of withstanding ESD pulses without experiencing avalanche breakdown in the buffer region of the GaN device.

Figure 1:
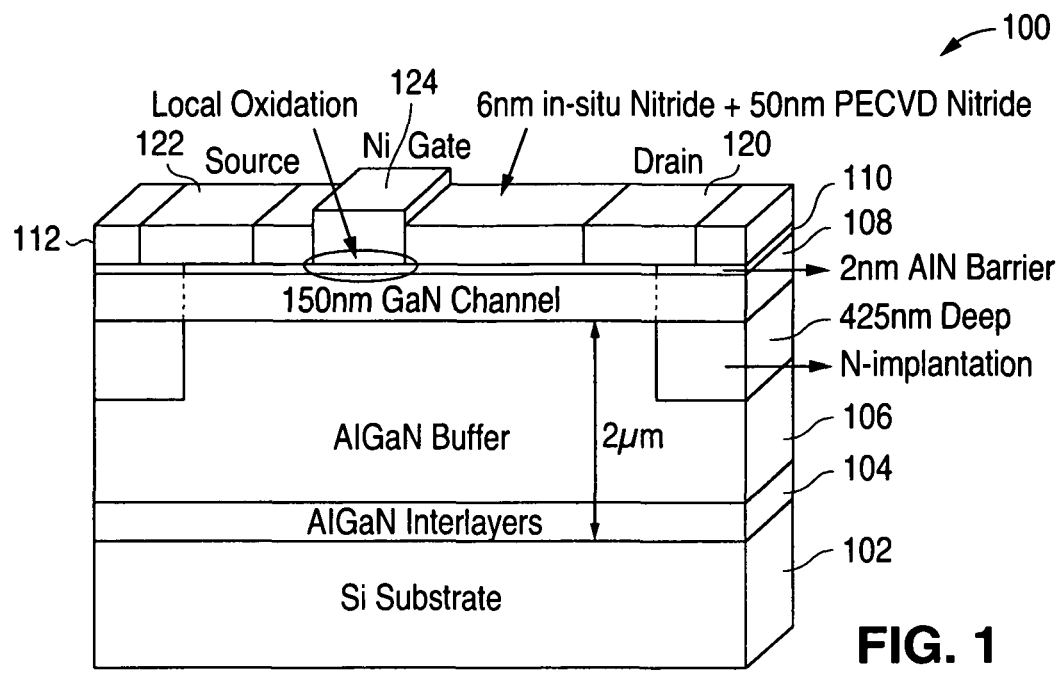
FIG. 1 is a three dimensional depiction of a prior art GaN device.
Figure 2:
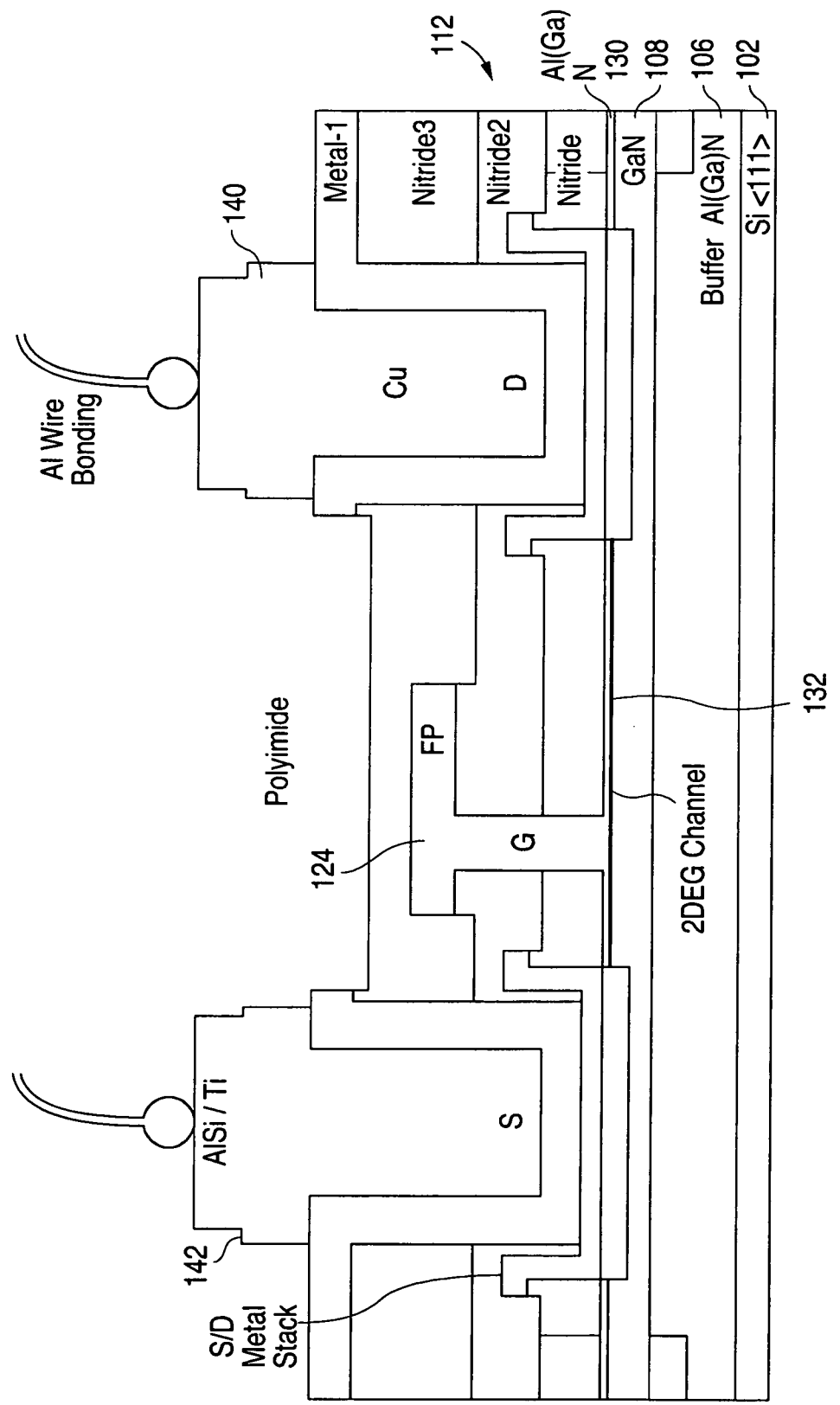
FIG. 2 is a detailed sectional view through a prior art GaN device.
Figure 3:
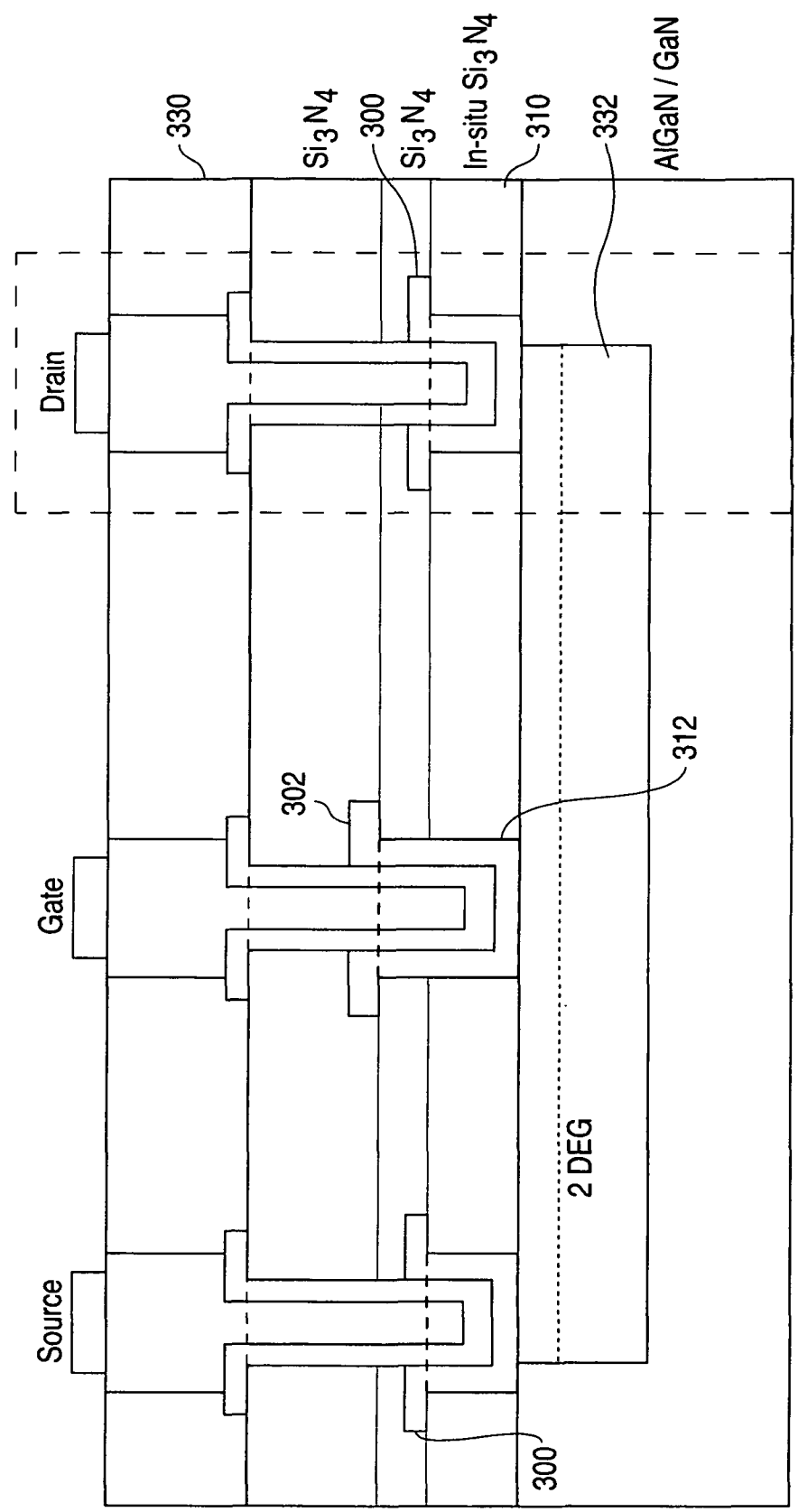
FIG. 3 is a sectional view through part of a prior art GaN device.

For a better understanding of a gallium nitride (GaN) process, the current IMEC GaN process design rules will be discussed with respect to FIGS. 1 to 3. In the GaN device 100 a number of epitaxial layers are deposited on the Si substrate 102. In particular AlGaN interlayers 104 are grown on the silicon substrate 102. A 2 μm thick buffer layer of AlGaN 106 is then grown on the interlayers 104. A 150 nm thick GaN channel 108 is grown on top of the AlGaN 106, followed by (in the device of FIG. 1) by a 2 nm thick AlN barrier 110. A 6 nm in-situ nitride and 50 nm PECVD nitride region, indicated generally by reference numeral 112 is formed on top of the AlN barrier 110. A drain 120 and source 122 are formed in the nitride layers 112, with a Ni gate 124 formed between them. Typically the AlN beneath the gate 124 is oxidized to form a local oxide (LO) layer. A slight variation of the structure of FIG. 1 is shown in FIG. 2, which uses the same reference numerals to indicate similar layers and regions. In the cross-section of FIG. 2 an AlGaN layer 130 is shown on top of the GaN channel 108. The interface between the GaN channel 108 and the AlGaN layer 130 defines a 2-D electron gas (2DEG) channel 132 that extends between the drain contact 140 and the source contact 142. The Schottky contact forms a gate 124 extending downward to the 2-D electron gas (2DEG) channel and is formed as a T-gate with a field gate overhang to the drain side. The formation of the drain and source metal stacks will be described with reference to FIG. 3. FIG. 3 shows a cross-section through a portion of a GaN device. In particular it shows the various layers involved in forming the Ohmic contacts and gate contact to the 2 DEG channel 332. The ohmic metallization 300 and gate metallization 302 are formed as two separate metallization's. In order to provide contact between the ohmic metallization and the 2DEG 332 the silicon nitride (SiN) 310 is etched away. Similarly silicon nitride (SiN) 310 is etched away to form the footprint of the gate 312. The top part of the gate as defined by the gate metal 302 provides the field gate overhang to the drain side. A single metal interconnect layer 320 (metal 1) is formed on the SiN layers. In order to provide contact between the metal interconnect 320 and the underlying ohmic metal 300 and gate metal 302, a passivation layer 330 that is deposited on top of the SiN is selectively etched open. The regions 350 are electroplated and a capping layer 352 is formed on top of the plated metal to prevent oxidation.

Tests have shown that as the width of the device is increased in a GaAs structure the failure current increases, however the same scaling is not found in GaN devices, possibly due to defects and dislocations in the material. Also the breakdown voltage was found to increase with increasing gate overhang. Nevertheless, device breakdown occurred in the range of between 100 and 300 V depending on the substrate material. In the case of Si substrate, device snapback was reached while in the case of silicon carbonate (SiC) substrates an abrupt transition to short-circuit conditions occurred. In all these devices, however, the snapback operation was found to be irreversible.

The present invention seeks to provide an ultra high voltage or grid voltage GaN structure (operable at 600-1000V) that includes ohmic or Schottky contacts and is based on avalanche injection breakdown in which the conductivity modulation is realized in the AlGaN buffer. In particular, the present invention proposes one or more isolation regions between the drain and source contacts. The one or more isolation regions may be implemented in different ways as is discussed in greater detail below.

Figure 5:
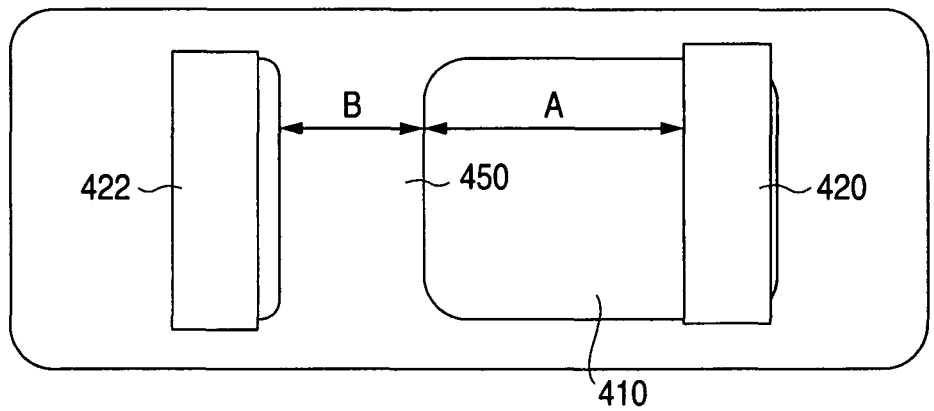
FIG. 5 is a top view of the device of FIG. 4.
Figure 4:
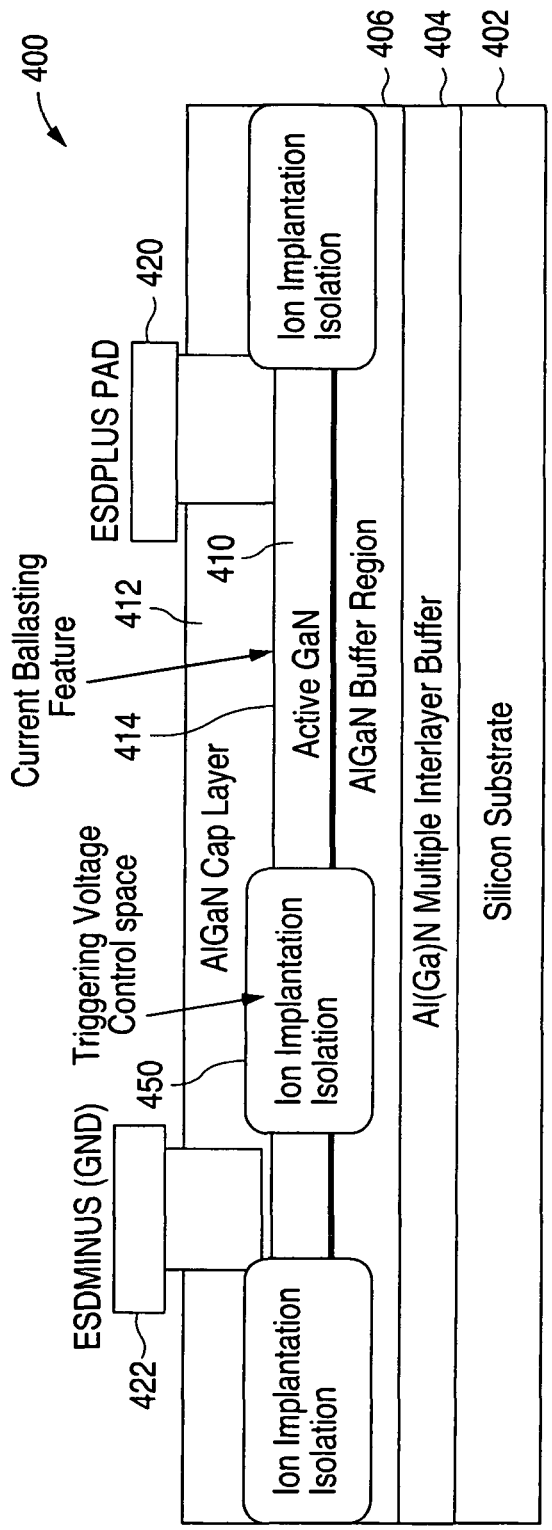
FIG. 4 is a sectional view through one embodiment of a GaN device of the invention.

FIG. 4 shows a cross-section through one embodiment of the invention. The GaN process device 400 includes a silicon substrate 402 with an AlGaN multiple interlayer buffer 404 and AlGaN buffer region 406 epitaxially grown on top of the silicon substrate 402, in similar fashion as is known in the art. An active GaN layer 410 is formed on top of the AlGaN layer 406 to define a channel region. An AlGaN cap layer 412 is formed on top of the active GaN layer 410 to form a 2D electron gas (2DEG) region 414 at the junction between the GaN layer 410 and the AlGaN cap layer 412. As shown in FIG. 4 Schottky or ohmic terminals in the form of a drain terminal 420 and a source terminal 422 extend downward toward the 2DEG region 414. As one aspect of the invention, an isolation region 450 in the form of an ion implantation region is formed between the contacts 420, 422. As shown in FIG. 5 (which shows a top view of the structure of FIG. 4), ion implantation region 450 extends between and around the contacts 420, 422. In this embodiment the length A of the GaN layer 410 between the terminal 420 and the isolation region 450 is chosen to be longer than the length B of the isolation region, thereby acting as a ballast region. In this embodiment the length B of the isolation region is approximately 1 um, while the length A of the ballast region is chosen to be between 1 and 10 um.

Figure 7:
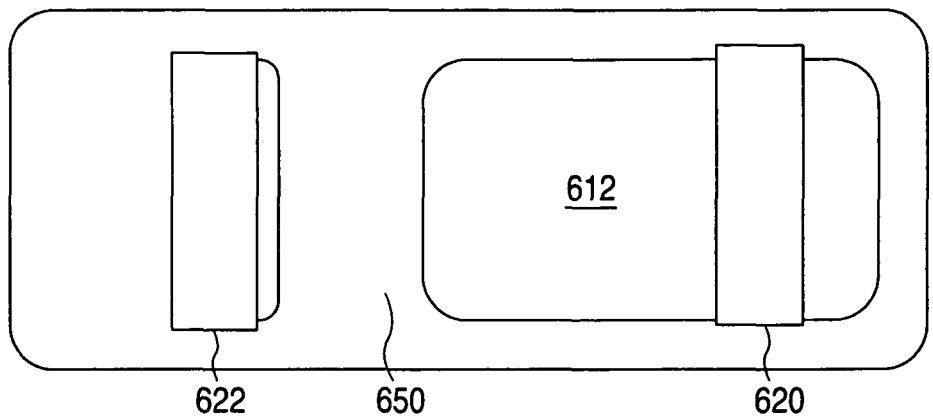
FIG. 7 is a top view of the device of FIG. 6.
Figure 6:
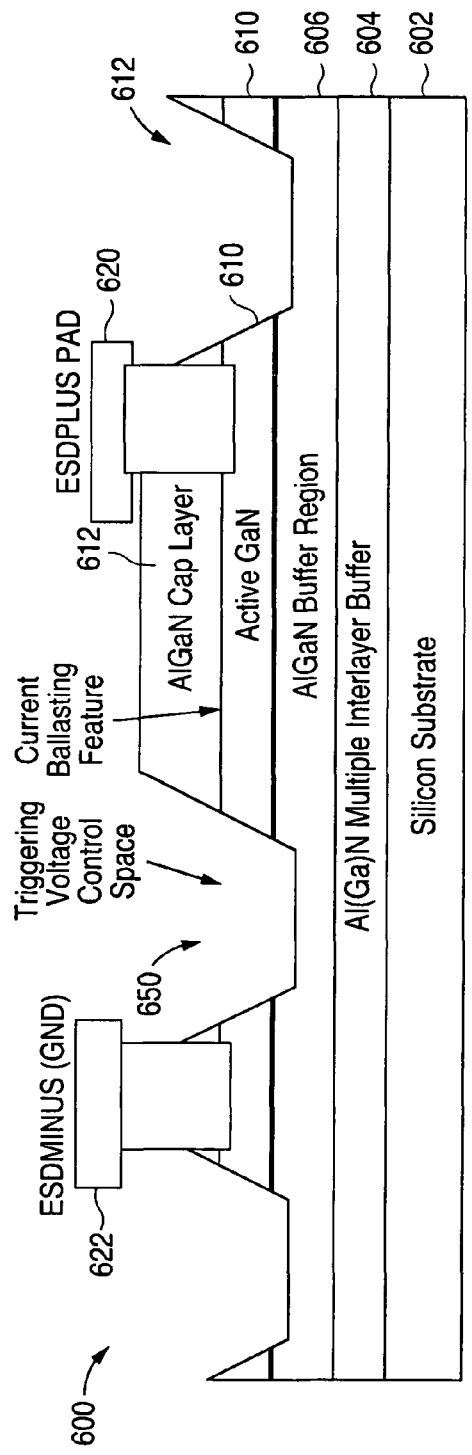
FIG. 6 is a sectional view through another embodiment of a GaN device of the invention.

Another embodiment of the invention is shown in cross-section in FIG. 6 and as a top view in FIG. 7. Again the device 600 is a GaN process device like the one discussed above with respect to FIGS. 4 and 5. The device 600 again includes a silicon substrate 602 with an AlGaN multiple interlayer buffer 604 and AlGaN buffer region 606 epitaxially grown on top of the silicon substrate 402. An active GaN layer 610 is again formed on top of the AlGaN layer 606. An AlGaN cap 612 is formed on top of the GaN region 610 to define a 2DEG interface region 614. FIG. 6 shows the drain and source terminals 620, 622 extending to the 2DEG region 614.

In this embodiment an isolation region between the drain and source contacts is provided by an etched-away region 650 that defines a triggering voltage control space, and is implemented as a mesa process. As shown in the top view of FIG. 7, the etched-away region 650 extends between and around the contacts 620, 622.

In the above embodiments ohmic contacts were formed for the drain and source terminals, however Schottky contacts could be formed instead.

While two forms of isolation were discussed above with respect to two specific embodiments, it will be appreciated that other forms of isolation between the drain and source contacts could be provided, such as multi-RESURF (Reduced Surface Field) layers.

The effect of spacing the drain and source contacts through the use of isolation regions allows the breakdown and triggering voltages to be controlled. In particular, by varying the space of isolation (length of the isolation region) the natural breakdown voltage can be adjusted. As discussed above, the ballasting region is included to provide for uniform current density distribution and to move the high electric field and heat generation away from the contacts and is typically chosen to be longer than the isolation region length. In one embodiment the length of the isolation region was kept to only about 1 um, while the ballasting region was in the range of 1 to 10 um. Both the Active GaN and AlGaN material are of low conductivity and can be used to act as ballast region.

Figure 8:
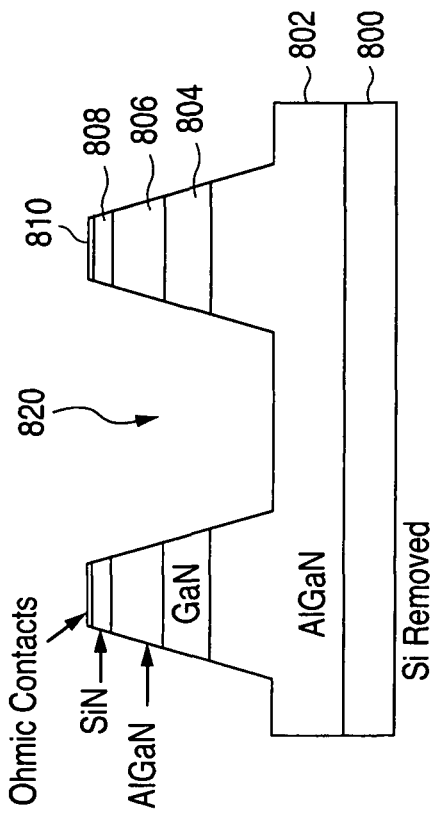
FIG. 8 is a sectional side view of another embodiment of a GaN device of the invention.

In yet another embodiment, the silicon substrate was removed altogether as shown in FIG. 8, and even higher voltage levels could be attained without suffering breakdown. The embodiment of FIG. 8 is similar to the embodiment of FIG. 6, with AlGaN multiple interlayer buffer 800, AlGaN buffer region 802, active GaN layer 804 (forming 2DEG region at the interface with AlGaN buffer region 802), AlGaN cap layer 806. It also shows the SiN layer 808 over the AlGaN cap layer 806, and the ohmic contact 810. Like the embodiment of FIG. 5, this embodiment includes etched-away isolation region 820. However, in this embodiment the Si substrate has been removed.

Figure 9:
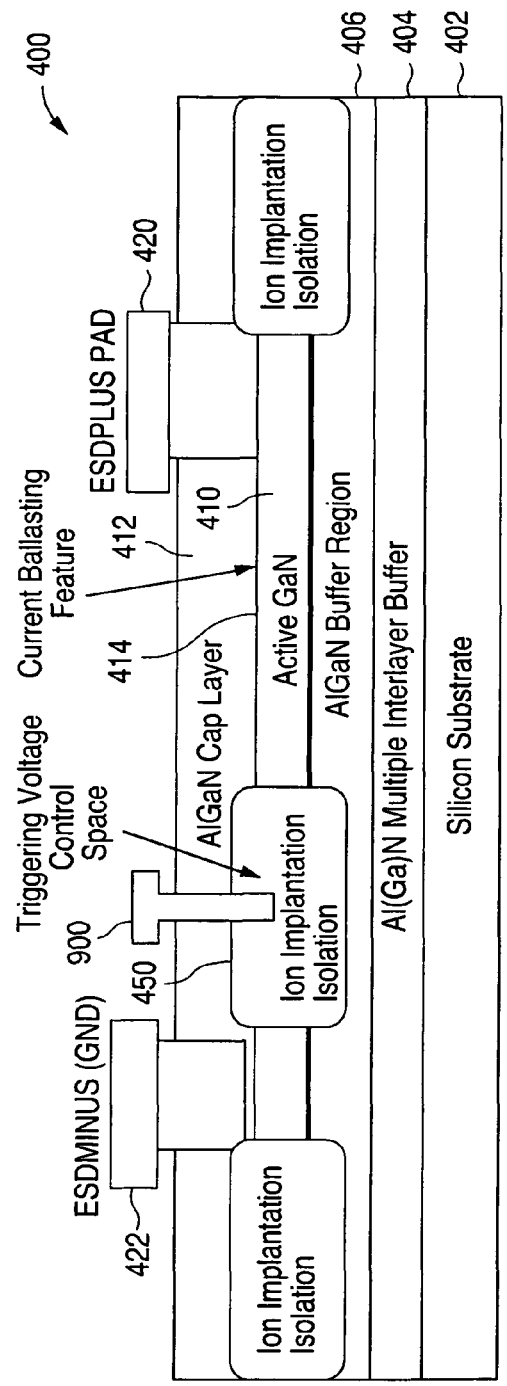
FIG. 9 is a side view of yet another embodiment of a GaN device of the invention.

Yet another embodiment of the invention is shown in FIG. 9. This embodiment is similar to that discussed with reference to FIGS. 4 and 5 and the same reference numerals have been used to depict similar regions. However, in this embodiment an additional contact 900 is provided that extends into the isolation region 450 to serve as a substrate pump. This allows the potential of the substrate to be changed to lower the triggering voltage of the GaN ESD protection device.

While the invention is described with respect to specific embodiments, the invention is not limited to these embodiments and can be implemented in different ways using GaN technology without departing from the scope of the invention.

What is claimed is:

1. A GaN ESD protection device consisting of
    a first terminal with an ohmic contact or Schottky contact,
    a second terminal with an ohmic contact or Schottky contact,
    a 2D electron gas (2DEG) region between the two terminals,
    a GaN channel region and an AlGaN cap layer formed over the GaN channel region, the 2DEG region being defined by the junction between the GaN channel region and the AlGaN cap layer,
    an AlGaN buffer region below the GaN channel region, and
    an isolation region formed between and around the two terminals, the isolation region is configured to form a ballast region extending laterally from the first terminal and terminating on the isolation region between the two terminals, the isolation region vertically extending from above the top of the 2D electron gas (2DEG) region down through the 2D electron gas (2DEG) region and the GaN channel region touching and terminating at the AlGaN buffer region, wherein the length of the isolation region is configured to control the breakdown and triggering voltages of the ESD device and the ballasting region is configured to provide uniform current density distribution through the ESD device and to move the high electric field and heat generation away from the contacts, wherein the length of the ballast region is longer than the isolation region length.

2. The device of claim 1, wherein the first terminal defines an ESDPLUS pad, and the second terminal defines an ESD-MINUS (GND).

3. The device of claim 1, wherein the isolation region comprises one or more etched-away portions or one or more ion implant regions.

4. The device of claim 3, further comprising a substrate and a substrate pump defined by a contact extending into the at least one isolation region to allow the potential of the substrate to be changed.

5. The device of claim 1, wherein the isolation region between the first and second terminals has a length of the order of 1 um.

6. The device of 5, wherein the GaN channel region between the first terminal and the isolation region is longer than the length of the isolation region.

7. The device of claim 6, wherein the GaN channel region between the first terminal and the isolation region is between 1 and 10 um.

8. A method of controlling the breakdown and triggering voltage of a high voltage GaN ESD protection structure that consists of a pair of terminals with ohmic or Schottky contacts connected to a 2DEG region, the method comprising, providing an isolation region between the terminals and extending vertically through the 2DEG region and the GaN channel region touching and terminating at the AlGaN buffer region, by varying the breakdown and triggering voltage of the device by varying the lateral length of the isolation region between the terminals,
    forming an AlGaN ballasting region below the GaN channel region,
    dimensioning the GaN channel region to be long enough to define a ballasting region between one of the terminals and the isolation region to provide for greater uniformity of the current density distribution and to move the high electric field and heat generation away from the terminals,
    wherein the length of the isolation region controls the breakdown and triggering voltages of the ESD device and the length of the ballast region is longer than the isolation region length.

9. The method of claim 8, wherein the 2DEG region is defined by providing an interface between a GaN channel region and an AlGaN layer.

10. The method of claim 9, wherein the AlGaN layer defining the 2DEG with the GaN channel is formed on top of the GaN channel region to define an AlGaN cap layer.

11. The method of claim 8, wherein the ballasting region is between 1 and 10 um in length.

12. The method of claim 8, further comprising forming the buffer region on top of a substrate material, and providing a substrate pump by providing a contact extending into the isolation region to allow the potential of the substrate material to be changed.

13. The method of claim 8, further comprising forming the buffer region on top of a substrate material, and subsequently removing the substrate material after forming at least some of the regions on the substrate material.

14. The method of claim 8, wherein the GaN ESD protection structure is used in ultra high voltage applications of 600-1000V and the triggering and breakdown voltage is controlled to avoid triggering or breakdown under said ultra high voltage operation.

15. A grid voltage GaN structure that consists of
    a pair of terminals with ohmic or Schottky contacts,
    a 2DEG region, defined by the junction between a GaN layer and an AlGaN layer, extending between the terminals, a vertically extending isolation region formed between the terminals that extends through the 2DEG and the GaN channel region touching and terminating at the AlGaN buffer region, and a ballast region defined by at least one of the GaN layer and the AlGaN layer extending between the one terminal and the isolation region, the ballast region being longer than the isolation region, wherein the length of the isolation region is configured to control the breakdown and triggering voltages of an ESD device and the ballast region is configured to provide uniform current density distribution through the ESD device and to move the high electric field and heat generation away from the contacts, wherein the length of the ballast region is longer than the isolation region length.

* * * * *